(12) United States Patent
Kiehl et al.

(10) Patent No.: US 6,373,769 B1
(45) Date of Patent: Apr. 16, 2002

(54) DECODED AUTOFRESH MODE IN A DRAM

(75) Inventors: Oliver Kiehl, Charlotte; Richard M. Parent, Shelburne, both of VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/583,086

(22) Filed: Jun. 12, 1997

(51) Int. Cl.[7] .............................................. G11C 8/00
(52) U.S. Cl. ................... 365/222; 365/230.03
(58) Field of Search ............... 365/222, 230.03, 365/230.06

(56) References Cited

U.S. PATENT DOCUMENTS

| | | | |
|---|---|---|---|
| 5,452,257 A | 9/1995 | Han | 365/230.03 |
| 5,469,376 A | 11/1995 | Obara | 365/189.07 |
| 5,471,430 A | 11/1995 | Sawada et al. | 365/222 |
| 5,511,033 A | 4/1996 | Jung | 365/222 |
| 6,049,497 A * | 4/2000 | Yero | 365/222 |

* cited by examiner

*Primary Examiner*—David Nelms
*Assistant Examiner*—M. Tran

(57) ABSTRACT

Dynamic random access memory chips (DRAMs) in a computer memory system are made to be more available for access by a processor even though an autorefresh cycle may be in progress when the processor attempts to access the memory system. A DECODED AUTOREFRESH mode is defined which allows refresh of certain banks of the DRAM only. The bank addresses from the external DRAM controller select the bank where the AUTOREFRESH has to be performed. The DRAM controller circuitry makes sure that every bank of the DRAM gets a refresh command often enough to retain information.

6 Claims, 3 Drawing Sheets

DECODED AUTOFRESH MODE IN A DRAM

BACKGROUND OF THE INVENTION

1. Field of the Invention

The present invention generally relates to dynamic random access memories (DRAMs) and, more particularly, to a technique which increases the availability of a DRAM by accessing non-refreshing portions of the DRAM.

2. Background Description

The storage cells of a dynamic random access memory (DRAM) need to be refreshed typically every 64 milliseconds (ms) to maintain data stored therein. In conventional DRAMs, an autorefresh cycle accomplishes refresh of a single row of storage cells. An Internal counter increments on every autorefresh cycle to refresh all the rows in the DRAM array. An AUTOREFRESH command, as set forth in standard JC-42.3-94-126, item #612, approved by the Joint Electronic Device Engineering Council (JEDEC) in January 1995, is issued to initiate this cycle. To issue this command, all banks of the DRAM have to be in an idle state, or at least in a state where an ACTIVATE command would be legal (i.e., not in a power down state). Thus, to retain the information stored in the DRAM under current standards, an AUTOREFRESH command has to be issued, for example, 4092 times every 64 ms. The need for refresh causes the DRAM to be unavailable to the system for some period of time. For example, the autorefresh cycle for the example given can be performed in 15.6 microseconds ($\mu$s), or a burst of 4092 autorefresh cycles every 64 ms. While the DRAM is being refreshed during the autorefresh cycle, it cannot be accessed by the processor. If the processor attempts to access the memory system during an autorefresh cycle, one or more wait states will occur. This is a potential source of performance degradation in computer systems, particularly with the newer high density memory chips.

SUMMARY OF THE INVENTION

It is therefore an object of the present invention to provide a technique which will allow DRAMs in a computer memory system to be more available for access by a processor even though an autorefresh cycle may be in progress when the processor attempts to access the memory system.

According to the invention, a DECODED AUTOREFRESH mode is defined which allows refresh of certain banks of the DRAM only. For example, if Bank 1 is idle, Banks 2 and 3 are precharging and Bank 0 is active and currently in a burst read operation, an AUTOREFRESH command can be issued on Bank 1 only, while the other banks continue to perform their tasks. The decoding is done much in the same way as coding in the precharge command (as in the JEDEC standard), where A11 decides whether the refresh is to be performed undecoded or decoded. In the latter case, the bank addresses from the external DRAM controller select the bank where the AUTOREFRESH has to be performed. The DRAM controller circuitry also makes sure that every bank of the DRAM gets a refresh command often enough to retain information.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
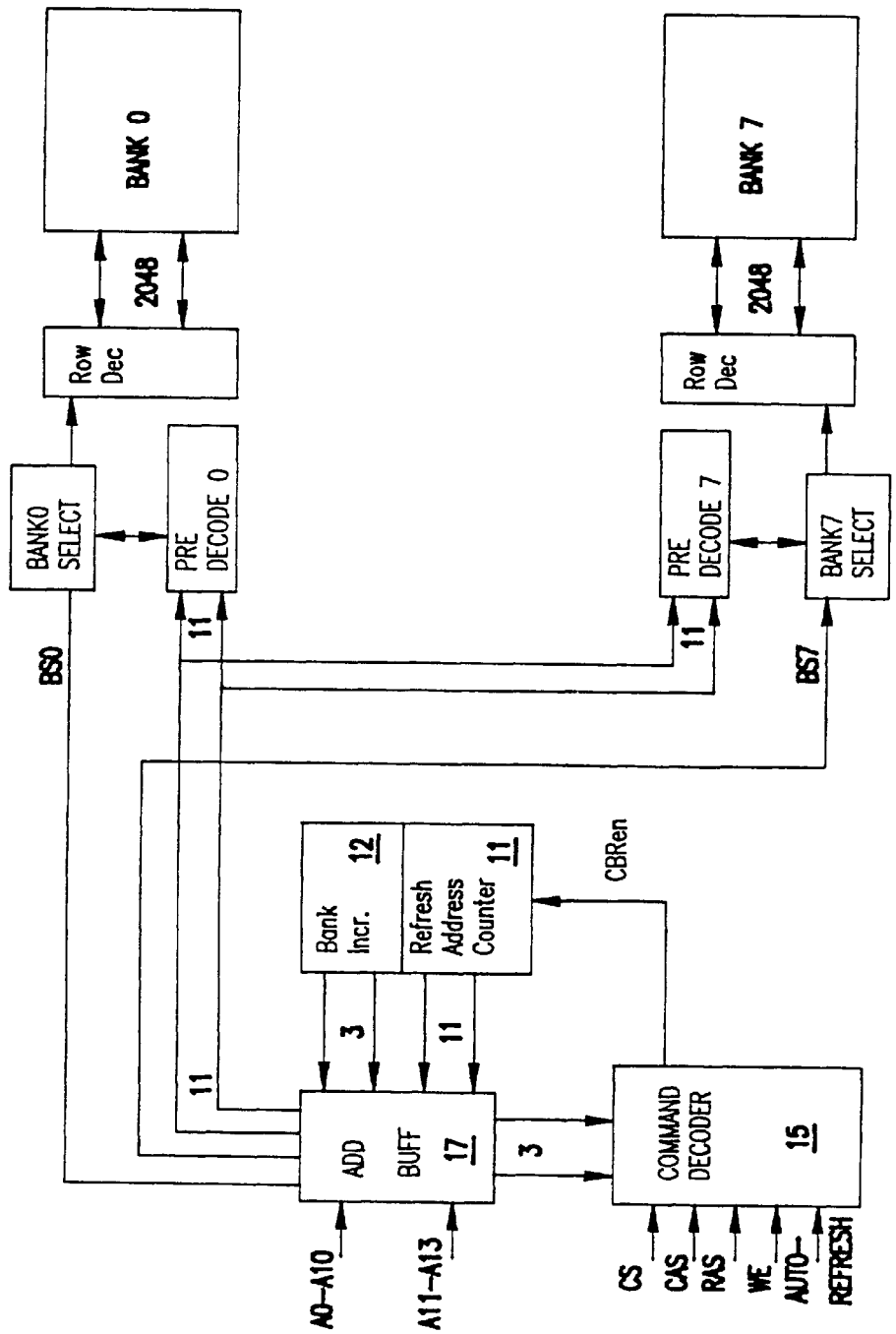
FIG. 1 is a block diagram illustrating the autorefresh cycle in a conventional DRAM.

Referring now to the drawings, and more particularly to FIG. 1, there is shown a conventional DRAM. Illustratively, the DRAM comprises m=11 row and n=3 bank addresses. That is, the DRAM is organized as an eight ($2^3$) bank DRAM with each bank having 2048 rows ($2^{11}$). Only Bank 0 and Bank 7 are shown, but it will be understood that there are six more banks, Bank 1 to Bank 6, and associated row decoding circuitry. The row decoding circuitry for each bank is driven by predecoder circuitry and a bank select circuit. The predecoder circuitry processes addresses from the address buffer 17, and the bank select circuit receives a bank select signal, BSn, enabling the bank select circuit to pass the output of the predecoder to the row decoder.

A command decoder 15 receives commands including Chip Select (CS), Column Address Strobe (CAS), Row Address Strobe (RAS), and Write Enable (WE), all of which are well understood in the art. In addition, the command decoder receives an AUTOREFRESH command. Upon receiving an AUTOREFRESH command, the command decoder 15 of the DRAM issues a command signifying that the chip is now in a CAS before RAS (CBR) refresh mode. This command signal (CBRen) activates the refresh address counter (RAC) 11 to drive the row addresses onto the internal address bus, overriding the outputs from the address buffers 17.

The AUTOREFRESH cycle then performs a refresh on the row address associated with the RAC 11 in all banks serially, via the bank incrementer 12. When the selected row of all the banks has been refreshed, the AUTOREFRESH cycle is completed. A precondition to this function is that all banks of the DRAM must be precharged and idle for a minimum of the precharge time.

Figure 2:
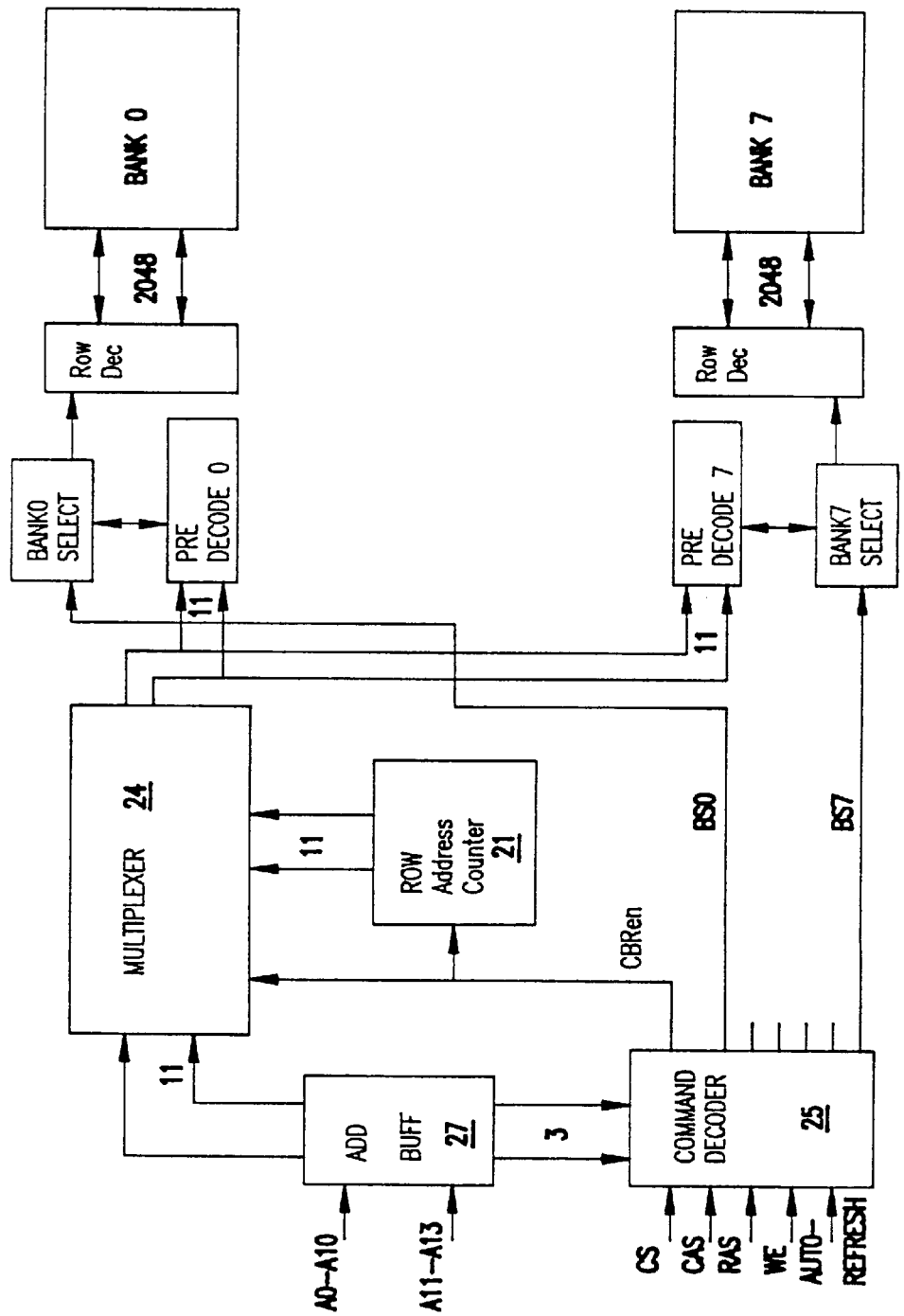
FIG. 2 is a block diagram illustrating the decoded autorefresh cycle according to the present intention.

The invention modifies the basic structure shown in FIG. 1 to support a DECODED AUTOREFRESH cycle. Such DECODED AUTOREFRESH is also useful in a synchronous DRAM (SDRAM). Referring to FIG. 2, the refresh address counter 21 is, for the example illustrated, an 11-bit counter. Thus, this counter cycles through only row addresses without any reference to a specific bank. The bank addresses are presented to the command decoder 25 from the address buffers 27, which then issues the bank select signal (BSn) to the appropriate bank, activating the bank for the subsequent AUTOREFRESH cycle. This requires that the bank selection in AUTOREFRESH mode must be determined by the external RAM controller (not shown). In addition, the command decoder 25 of the DRAM issues a command signifying that the chip is performing a CAS before RAS (CBR) refresh mode. This same command signal (CBRen) must inform the multiplexer 24 to receive the row address from the refresh address counter (RAC) 21 while, in addition, blocking the multiplexer output from disrupting ongoing chip activities (i.e., in other active banks).

Figure 3:
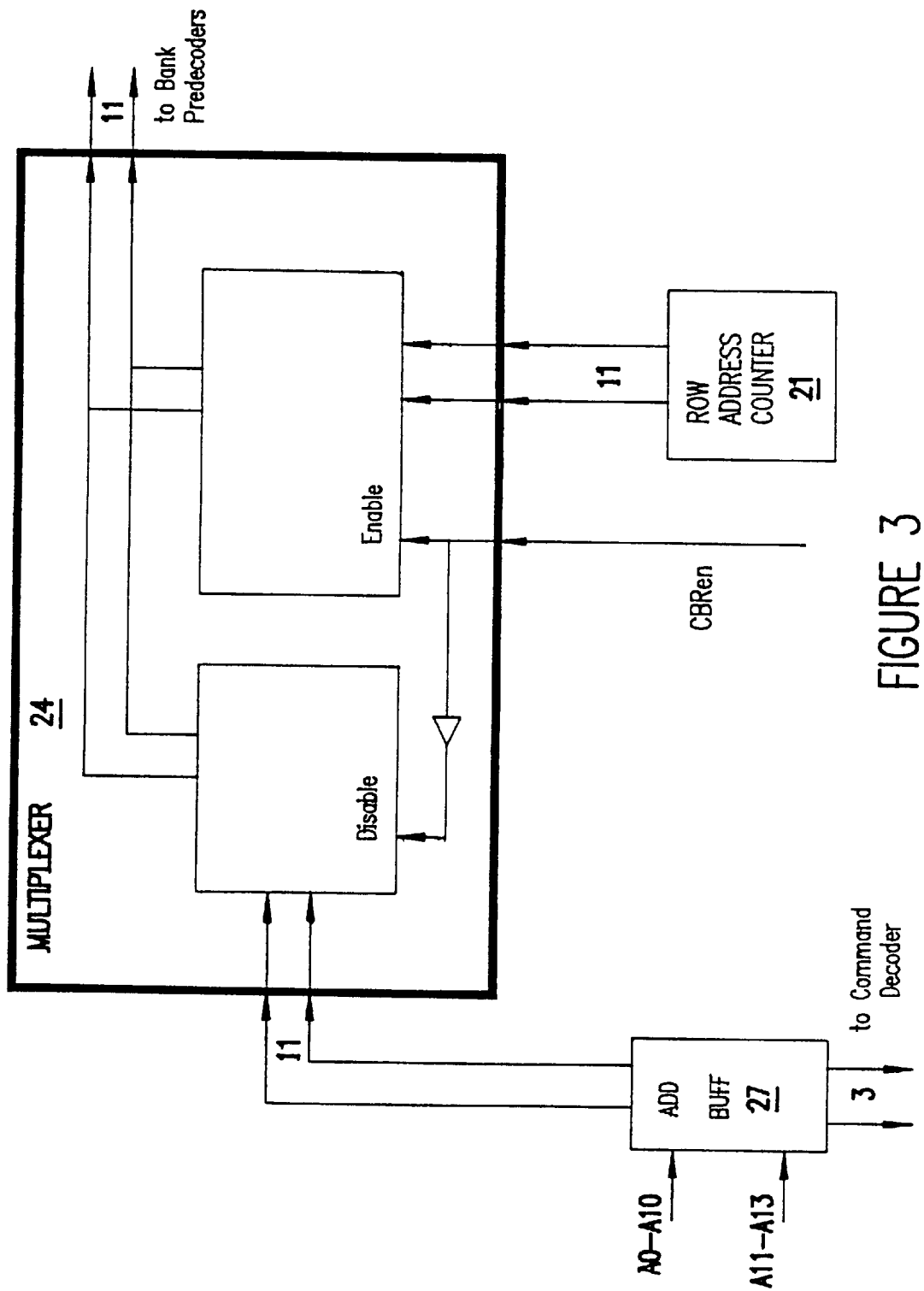
FIG. 3 is a block diagram of the multiplexer function shown in FIG. 2.

A simplified view of the inner workings of the multiplexer 24 is shown in FIG. 3. The control signal (CBRen) enables the path for the refresh address counter 21 outputs, while simultaneously disabling the address buffer 27 outputs. The eleven addresses are then presented to the row predecoders for all banks. Simultaneously, external address inputs A11–A13 are driven to the DRAM by the memory controller. These high order addresses are then received by address buffers 27 and driven to the command decoder 25. The corresponding bank select line is then driven active from the command decoder, allowing that bank's row predecoder to process the addresses. The remainder of the banks do not receive the bank select signal; therefore, the row predecoders are disabled.

As one alternative embodiment, the bank addresses could be left in the refresh address counter as in the conventional DRAM shown in FIG. 1. However, the multiplexer 24 would then be modified to allow for decoded and undecoded autorefresh by means of a mode switch.

While this improvement may not be as important in an eight bank system of this simple example, it becomes quite important in sixty-four and more bank systems. Thus, although the invention has been described in terms of a single exemplary embodiment with a proposed modification, those skilled in the art will recognize that the invention can be practiced with modification within the spirit and scope of the appended claims.

Having thus described our invention, what we claim as new and desire to secure by Letters Patent is as follows:

1. A dynamic random access memory (DRAM) chip organized into a plurality of banks of multiple rows, said DRAM chip comprising:

a refresh address counter which, when activated for an autorefresh cycle, generates row addresses;

decoding means for decoding which of said plurality of banks of the DRAM chip are to be refreshed at the time of an AUTOREFRESH command, said decoding means generating bank addresses indicating those banks of the DRAM chip which are to be refreshed;

a selector responsive to said decoding means for directing row addresses from the refresh counter to only those banks of the DRAM chip which are to be refreshed; and means for blocking the selector from disrupting other active banks allowing the other active banks of the DRAM chip to continue current processing.

2. The DRAM chip recited in claim 1 further comprising an address buffer and wherein the selector is a multiplexer which receives row addresses from the refresh address counter and row addresses from the address buffer, the decoding means generating a CAS before RAS (CBR) mode signal in response to the AUTOREFRESH command for those banks of the DRAM chip that are indicated by the bank addresses, the multiplexer being responsive to the CBR signal to pass the row addresses from the refresh address counter.

3. The DRAM chip recited in claim 2 wherein the decoding means is a command decoder receiving the AUTOREFRESH command and directly generating bank select signals for those banks of the DRAM chip are to be refreshed at the time of an AUTOREFRESH command.

4. The DRAM chip recited in claim 2 is a synchronous DRAM chip.

5. The DRAM chip recited in claim 3 is a synchronous DRAM chip.

6. A dynamic random access memory (DRAM) chip organized into a plurality of banks of multiple rows, said DRAM chip comprising:

a refresh address counter which, when activated for an autorefresh cycle, generates row addresses;

decoding means for decoding which of said plurality of banks of the DRAM chip are to be refreshed at the time of an AUTOREFRESH command, said decoding means generating bank addresses indicating those banks of the DRAM chip which are to be refreshed;

a selector responsive to said decoding means for directing row addresses from the refresh counter to only those banks of the DRAM chip which are to be refreshed; and an address buffer, wherein the selector is a multiplexer which receives row addresses from the refresh address counter and row addresses from the address buffer, the decoding means generating a CAS before RAS (CBR) mode signal in response to the AUTOREFRESH command for those banks of the DRAM chip that are indicated by the bank addresses, the multiplexer being responsive to the CBR signal to pass the row addresses from the refresh address counter.

\* \* \* \* \*